United States Patent
Medina Silva et al.

(10) Patent No.: US 12,245,531 B2
(45) Date of Patent: Mar. 4, 2025

(54) RESISTIVE MEMORY DEVICE STRUCTURE BASED ON STACKED LAYERS OF NANOCRYSTALLINE TMDCS

(71) Applicant: AGENCY FOR SCIENCE, TECHNOLOGY AND RESEARCH, Singapore (SG)

(72) Inventors: Henry Medina Silva, Singapore (SG); Dongzhi Chi, Singapore (SG); Jianwei Chai, Singapore (SG); Ming Yang, Singapore (SG); Shijie Wang, Singapore (SG); Shi Wun Tong, Singpore (SG); Carlos Manzano, Singpore (SG)

(73) Assignee: Agency for Science, Technology and Research, Singapore (SG)

( * ) Notice: Subject to any disclaimer, the term of this patent is extended or adjusted under 35 U.S.C. 154(b) by 458 days.

(21) Appl. No.: 17/636,833

(22) PCT Filed: Sep. 18, 2020

(86) PCT No.: PCT/SG2020/050533
§ 371 (c)(1),
(2) Date: Feb. 18, 2022

(87) PCT Pub. No.: WO2021/054898
PCT Pub. Date: Mar. 25, 2021

(65) Prior Publication Data
US 2022/0278276 A1    Sep. 1, 2022

(30) Foreign Application Priority Data
Sep. 18, 2019    (SG) .......................... 10201908663Q

(51) Int. Cl.
H10N 70/00    (2023.01)
C01B 19/00    (2006.01)
H10N 70/20    (2023.01)

(52) U.S. Cl.
CPC ....... *H10N 70/8822* (2023.02); *C01B 19/007* (2013.01); *H10N 70/021* (2023.02); *H10N 70/245* (2023.02); *H10N 70/826* (2023.02)

(58) Field of Classification Search
CPC .................................................... H10N 70/00
See application file for complete search history.

(56) References Cited

U.S. PATENT DOCUMENTS

2020/0027504 A1*    1/2020    Sharma .................. H10B 63/30

FOREIGN PATENT DOCUMENTS

| CN | 106654009 A | 5/2017 |
|---|---|---|
| CN | 109524544 A | 3/2019 |

(Continued)

OTHER PUBLICATIONS

Shulaker et al., "Three-dimensional integration of nanotechnologies for computing and data storage on a single chip," Nature, vol. 547, Jul. 6, 2017, pp. 74-78.

(Continued)

*Primary Examiner* — Marvin Payen
(74) *Attorney, Agent, or Firm* — Womble Bond Dickinson (US) LLP

(57) ABSTRACT

Herein provided is a multilayered structure including one or more nanocrystalline layers each comprising a transition metal dichalcogenide, one or more substantially amorphous electrically insulating layers each comprising a transition metal oxide, wherein the transition metal oxide comprises a transition metal which is identical to the transition metal of the transition metal dichalcogenide, wherein the one or more nanocrystalline layers and the one or more substantially (Continued)

amorphous electrically insulating layers are formed in an alternating manner, and wherein each of the one or more nanocrystalline layers is formed adjacent to the substantially amorphous insulating layer. A resistive memory device comprising the multilayered structure and a process of fabricating the multilayered structure are also disclosed herein.

19 Claims, 11 Drawing Sheets

(56) References Cited

FOREIGN PATENT DOCUMENTS

| | | |
|---|---|---|
| CN | 111029459 A | 4/2020 |
| WO | 2016013984 A1 | 1/2016 |
| WO | 2018125237 A1 | 7/2018 |

OTHER PUBLICATIONS

Burr et al., "Neuromorphic computing using non-volatile memory," Advances in Physics: X, 2017, vol. 2, No. 1, pp. 89-124, DOI: 10.1080/23746149.2016.1259585.

Kang et al., "Layer-by-layer assembly of two-dimensional materials into wafer-scale heterostructures," Nature, vol. 550, Oct. 12, 2017, pp. 229-233.

Kim et al., "Chiral atomically thin films," Nature Nanotechnology, vol. 11, Jun. 2016, pp. 520-524.

Xu et al., "Vertical MoS2 Double-Layer Memristor with Electrochemical Metallization as an Atomic-Scale Synapse with Switching Thresholds Approaching 100 mV," Nano Letters, 19.4, 2019, pp. 2411-2417.

Chai Jianwei et al., "MoS 2 /Polymer Heterostructures Enabling Stable Resistive Switching and Multistate Randomness," Advanced Materials, Aug. 26, 2020, vol. 32, No. 42, pp. 2002704.

Bessonov et al., "Layered memristive and memcapacitive switches for printable electronics," Nature Materials, Nov. 10, 2014, vol. 14, pp. 199-204.

Chen et al., "An RRAM with a 2D Material Embedded Double Switching Layer for Neuromorphic Computing," 2018 IEEE 13th Nanotechnology Materials and Devices Conference (NMDC), Oct. 17, 2018, pp. 1-4.

International Preliminary Report on Patentability of the Patent Cooperation Treaty for PCT Application No. PCT/SG2020/050533 issued on Mar. 15, 2022, 7 pages.

The International Search Report of the International Searching Authority for PCT Application No. PCT/SG2020/050533 mailed Nov. 23, 2020, 4 pages.

The Written Opinion of the International Searching Authority for PCT Application No. PCT/SG2020/050533 mailed Nov. 23, 2020, 6 pages.

* cited by examiner

FIG. 2
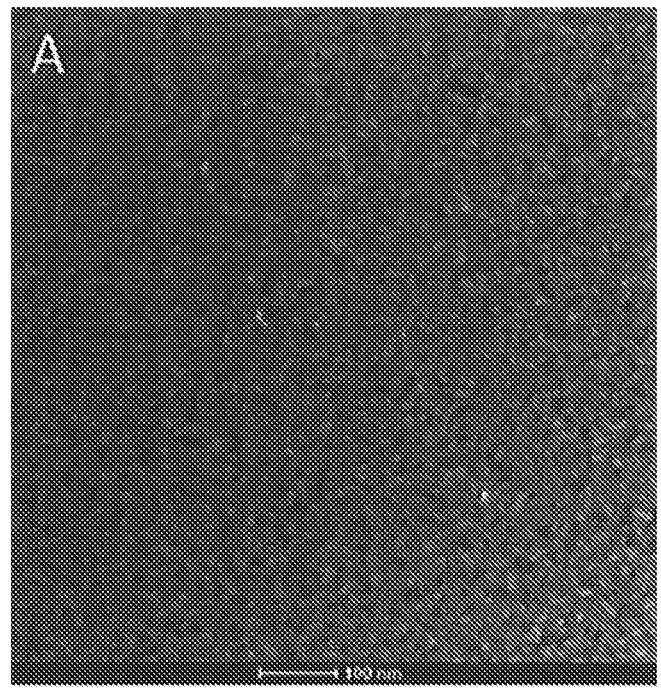
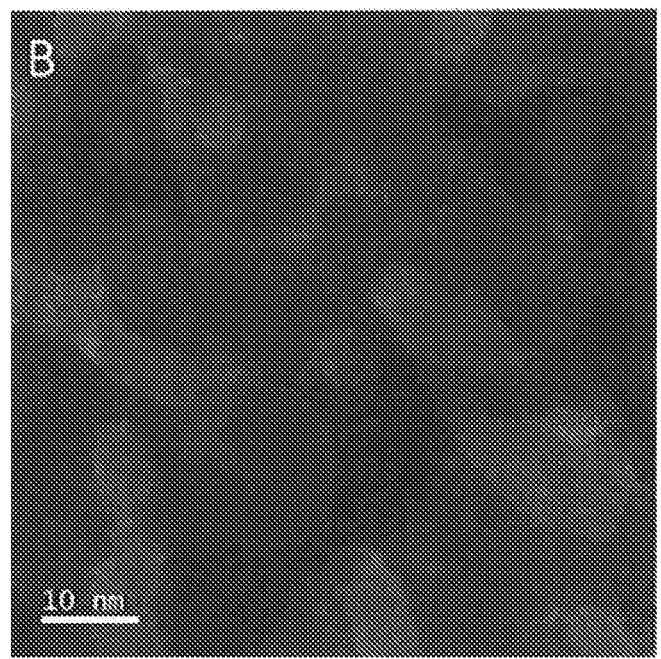

FIG. 9

| Composition | Thickness (nm) | Grain size of MoS₂ (nm) | No. of stacked Structure | Deposition process of MoS₂ layer | Transferable | Wafer-sized & atomically smooth | Device structure |
|---|---|---|---|---|---|---|---|
| Multiple stacked MoS₂/MoOₓ layers | MoS₂ ~8, MoOₓ ~3, Total ~20 | ~10 | ≥2 | PVD-grown | ✓ | ✓ | Fig. 7 |
| MoS₂-PVP | ~70 | ~200 | N.A. | Solution-processed | ✗ | ✗ | Fig. 8a |
| MoS₂-GO | ~100 | ~1000 | N.A. | Solution-processed | ✗ | ✗ | Fig. 8a |
| MoS₂-MOF | ~80 | unknown | N.A. | Solution-processed | ✗ | ✗ | Fig. 8a |
| MoSₓOₓ | >40 | >1000 | N.A. | Mechanically exfoliated flakes | ✓ | ✗ | Fig. 8a |
| MoS₂ fibers | ~100 | ~1000 | N.A. | Solution-processed | ✗ | ✗ | Fig. 8b |
| MoS₂/MoOₓ | MoS₂ 50-800, MoOₓ <3 | 100-400 | N.A. | Solution-processed | ✗ | ✗ | Fig. 8c |

RESISTIVE MEMORY DEVICE STRUCTURE BASED ON STACKED LAYERS OF NANOCRYSTALLINE TMDCS

CROSS REFERENCE TO RELATED APPLICATIONS

This application is a US national phase application under 35 USC 371 of international application no. PCT/SG2020/050533, filed 18 Sep. 2020, which claims the benefit of priority of Singapore Patent Application No. 10201908663Q, filed 18 Sep. 2019, the content of it which was incorporated by reference in its entirety for all purposes.

TECHNICAL FIELD

The present disclosure relates to a multilayered structure. The present disclosure also relates to a resistive memory device comprising the multilayered structure and a process for fabricating the multilayered structure.

BACKGROUND

The development of non-volatile memory devices, such as resistive switching memories (ReRam) in terms of its vertically stacked structures may have been of great interest for hyperscaling (i.e. vertical stacking with reduced thickness) and three dimensional integration. Interestingly, the non-volatile memory devices may have been suggested for applications in neuromorphic computing technologies (non-Von Neumann architectures, e.g. in-memory computing).

Among various switching materials, metal oxides have been studied, which demonstrated promising device performance, including high switching ratio, long programming time, and high cycling endurance. Apart from this, increasing attention may have been directed to two dimensional layered materials that may outperform conventional oxide bulks for applications in lower power or wearable devices. However, the two dimensional layered materials tend to suffer from one or more limitations. For instance, the quality of the two dimensional layer tends to be difficult to control or cannot be scaled up for mass production. For example, the resistive switching afforded by reported two dimensional layered materials tends to be limited to a horizontal configuration, which places a constraint for minimizing the size of device/structure in order not to compromise grain boundaries responsible for the resistive switching. Moreover, memory devices/structures based purely on grain boundaries tend to suffer from small on/off ratio ($\sim 10^2$) or thickness of device/structure is reduced likely at the expense of the on/off ratio. In other examples, some reported two dimensional layered materials suffer in terms of not having a minimum or too much roughness when their thickness is controlled, wherein lack of or too much of roughness may lead to poor resistive switching performance.

There is thus a need to provide for a solution that addresses one or more of the limitations mentioned above. The solution should at least provide for a multilayered structure operable for a non-volatile memory device.

SUMMARY

In a first aspect, there is provided a multilayered structure including:
one or more nanocrystalline layers each comprising a transition metal dichalcogenide;
one or more substantially amorphous electrically insulating layers each comprising a transition metal oxide, wherein the transition metal oxide comprises a transition metal which is identical to the transition metal of the transition metal dichalcogenide;
wherein the one or more nanocrystalline layers and the one or more substantially amorphous electrically insulating layers are formed in an alternating manner, and
wherein each of the one or more nanocrystalline layers is formed adjacent to the substantially amorphous insulating layer.

In another aspect, there is provided a resistive memory device comprising the multilayered structure described according to various embodiments of the first aspect.

In another aspect, there is provided a process of fabricating the multilayered structure described according to various embodiments of the first aspect, the process includes:
providing a substrate comprising a nanocrystalline layer and a polymer layer deposited thereon, wherein the polymer layer is deposited on the nanocrystalline layer, wherein the nanocrystalline layer comprises a transition metal dichalcogenide;
separating the nanocrystalline layer with the polymer layer thereon from the substrate in an aqueous medium;
arranging the nanocrystalline layer with the polymer layer thereon on a target substrate which is heated prior to having the nanocrystalline layer and the polymer layer arranged thereon, wherein the target substrate is heated to a temperature which renders formation of a substantially amorphous electrically insulating layer on the nanocrystalline layer, wherein the substantially amorphous electrically insulating layer comprises a transition metal oxide, wherein the transition metal oxide comprises a transition metal which is identical to the transition metal of the transition metal dichalcogenide; and
removing the polymer layer from the nanocrystalline layer.

BRIEF DESCRIPTION OF THE DRAWINGS

The drawings are not necessarily to scale, emphasis instead generally being placed upon illustrating the principles of the present disclosure. In the following description, various embodiments of the present disclosure are described with reference to the following drawings, in which:

FIG. 2A shows a low resolution TEM image of crystalline molybdenum disulfide layer produced by a present process of physical vapor deposition (PVD) from the top-down view. Scale bar denotes 100 nm.

FIG. 2B shows a higher resolution TEM image of the crystalline molybdenum disulfide layer of FIG. 2A from the top-down view. Scale bar denotes 10 nm.

FIG. 9 is a table comparing structural configuration of the active layer in existing devices and a device having the present multilayered structure. For brevity, some materials mentioned in the table are abbreviated as follows: PVP denotes polyvinylpyrrolidone, GO denotes graphene oxide, MOF denotes metal organic frameworks.

DETAILED DESCRIPTION

The following detailed description refers to the accompanying drawings that show, by way of illustration, specific details and embodiments in which the present disclosure may be practiced.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same, or similar feature in the other embodiments.

The present disclosure relates to a multilayered structure having one or more nanocrystalline layers each including a transition metal dichalcogenide (TMDC), and one or more amorphous electrically insulating layers. The layer that includes the transition metal dichalcogenide is referred herein as a nanocrystalline layer, since the transition metal dichalcogenide is formed as a layer of crystal grains, wherein the crystal grains are nano-sized (e.g. about 1 µm in diameter or fess, or even 20 nm in diameter or less). The term "transition metal dichalcogenide" herein refers to a chemical compound formed of a transition metal element and two chalcogen elements. The term "chalcogen" herein refers to an element from group 16 of the periodic table, and includes sulfur, selenium, tellurium, and polonium. In the context of the present disclosure, oxygen is excluded from the definition of chalcogen. In certain instances, the nanocrystalline layer may include or may be a layer of hexagonal boron nitride (hBN).

The multilayered structure is formed an alternating vertical arrangement of the nanocrystalline layer and the amorphous electrically insulating layer. In other words, a nanocrystalline layer is arranged or formed adjacent to an amorphous electrically insulating layer. Where there are more than one nanocrystalline layers and more than one amorphous electrically insulating layers, each amorphous electrically insulating layer may be sandwiched between two nanocrystalline layer, i.e. one amorphous layer is positioned adjacent to and between two transition metal dichalcogenide layers. As the present multilayered structure is a stacking of such layers in a vertical arrangement, the present multilayered structure may be interchangeably herein referred to as a stacked structure, a stacked layered structure, a vertical stack and a vertically stacked structure.

Figure 10A:
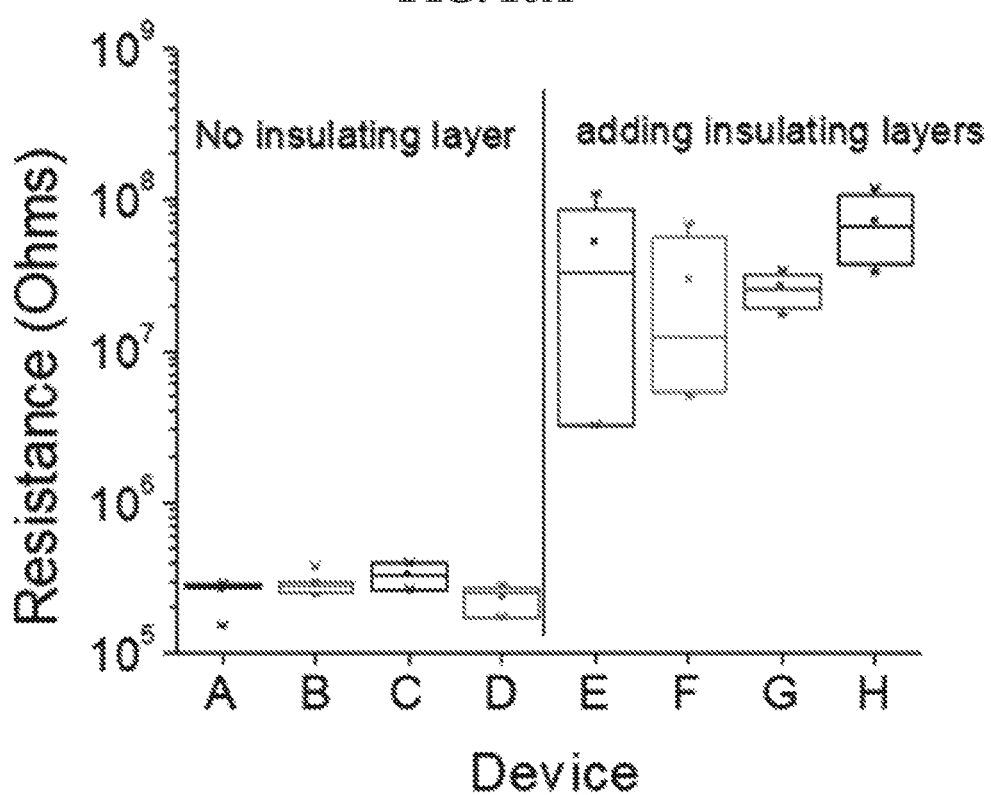
FIG. 10A shows a plot of intrinsic resistance of 8 cells before cycling, wherein the cells were prepared with (right side of plot) and without insulating layers (left side of plot).

Advantageously, the vertically stacked multilayered structure increases on/off ratio without having any scaling restrictions. A ReRAM cell can demonstrate two states, a high resistance state (HRS) and a low resistance state (LRS). HRS is basically given by the intrinsic resistance of the active area. In the context of the present disclosure, introducing ultrathin insulating layers into the active material (material that form the conductive paths) largely increases this intrinsic resistance. The LRS is determined by the formation of conductive paths into the active area, offering a low resistance path. By using a thin insulator layer in contrast with a thicker insulator, the formation of the conductive paths does not get adversely affected or even affected. FIG. 10A shows a comparison of cells prepared with and without insulating layer.

Figure 10B:
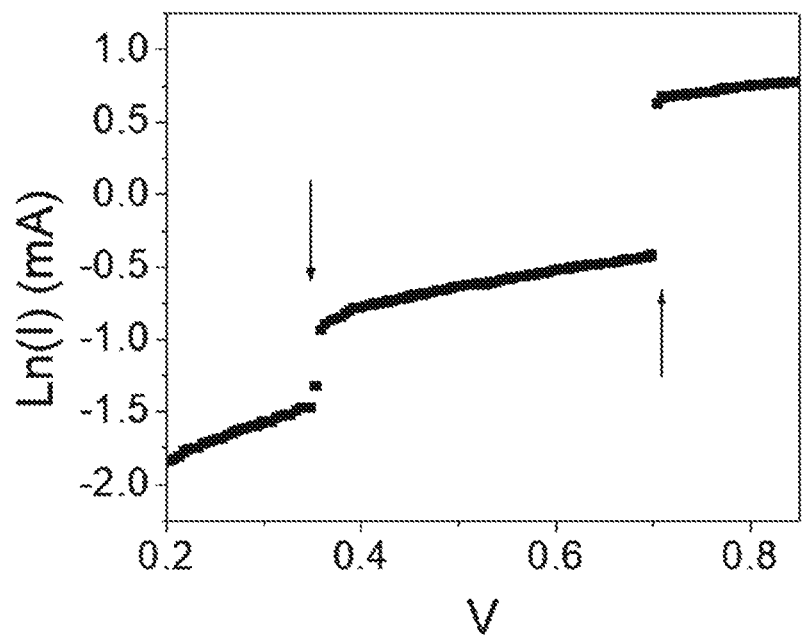
FIG. 10B shows the ramp voltage of a cell having 2 insulating layers, demonstrating two jumps and one intermediate resistance state.

The vertically stacked multilayered structure also renders multiple memory step (i.e. multiple memory state) possibilities. In the context of the present disclosure, it can be observed that after cycling, a cell composed of two insulating layers showed two jumps in comparison with only one jump observed for a cell prepared having only one insulating layer (see FIG. 10B). The intermediate resistance state between the two jumps can be seen as an additional state for memory.

Accordingly, a resistive memory device including such a multilayered structure has the same advantages. The resistive memory device of the present disclosure, which includes the multilayered structure, may be a non-volatile memory device.

The present disclosure also relates to a process of fabricating such a multilayered structure.

Figure 11:
FIG. 11 is a schematic which shows that if the roughness is larger than the thickness of the films, it is more likely for discontinuous layers to be formed in a multilayered structure.

Conventionally, layered molybdenum disulfide ($MoS_2$) as a transition metal dichalcogenide has been studied and considered a promising resistive switching material. Reportedly, the molybdenum disulfide layer tends to be constructed from molybdenum disulfide powder or as an exfoliated molybdenum disulfide layer. However, the quality of such molybdenum disulfide layer, especially the powder form, tends to be difficult to control. Such molybdenum disulfide layer may not be easily scaled up without compromising electrical performance. This is because in the molybdenum disulfide powder and exfoliated molybdenum disulfide layer, the grains tend to be unconnected, and the powder or flakes are typically disoriented, both of which undesirably render larger cell-to-cell variation, or even significant layer-to-layer variation. In addition, the molybdenum disulfide powder and exfoliated molybdenum disulfide layer tend to have undesirable roughness that may adversely affect the thickness of each layer, including uneven thickness and increase in thickness. Electrical properties of each layers may be compromised due to uneven thickness or increased thickness arising from such roughness. FIG. 11 shows how uneven thickness and increased thickness arise from undesirable roughness. As the layer thickness is of the order of few nanometers, the roughness becomes a significant factor. In the schematic of FIG. 11, if the roughness is larger than the thickness of the films, it is also more likely for a single layer to be formed as discontinuous layers.

However, the multilayered structure of the present disclosure can be based on a resistive memory device structure that offers improved performance utilizing stacking layers of sputtered large-scale nanocrystalline molybdenum disulfide and an insulating layer. Compared to other molybdenum disulfide ReRam devices, the nanocrystalline transition metal dichalcogenide of the present disclosure, such as nanocrystalline molybdenum disulfide, which may be grown by physical vapor deposition (PVD), allows for a precise thickness control over, e.g. a wafer-sized area, displaying excellent switching behavior and serves as a fundamental building block structure for resistive switching memories (ReRam) due to the precise thickness deposition and control of nanometer scale grain. The present structure includes multiple stacked layers.

The parameters of the present process advantageously produce nanoscale grain size. The transfer process involved in the present process advantageously renders stacking of the nanocrystalline and amorphous layers at low temperatures. The amorphous layers are also formed, e.g. instantaneously, without the need to be first formed as a separate layer. Through the present process, the number and thickness of the molybdenum disulfide layers stacked can be controlled, which in turn renders better control over set/reset voltages, current on/off ratio, and multiple memory step possibilities.

Details of various embodiments of the present multilayered structure, resistive memory device, process of fabricating the multilayered structure, and advantages associated with the various embodiments are now described below.

In the present disclosure, there is provided a multilayered structure that includes one or more nanocrystalline layers each including a transition metal dichalcogenide, one or more substantially amorphous electrically insulating layers each including a transition metal oxide, wherein the transition metal oxide includes a transition metal which is identical to the transition metal of the transition metal dichalcogenide, wherein the one or more nanocrystalline layers and the one or more substantially amorphous electrically insulating layers are formed in an alternating manner, and wherein each of the one or more nanocrystalline layers is formed adjacent to the substantially amorphous insulating layer. One of the advantages is that the on/off ratio is increased due to the electrically insulating layer, not just because it is amorphous.

In the context of the present disclosure, the amorphous electrically insulating layer may be entirely amorphous but need not be entirely amorphous, it may be partially or substantially amorphous such that crystalline portions may be present therein. In certain instances, the amorphous electrically insulating layer may be crystalline but includes amorphous portions. Notwithstanding this, as the insulating property (and not its crystallinity) is a key factor, the amorphous electrically insulating layer may be referred herein as an electrically insulating layer.

In embodiments having more than one nanocrystalline layer and more than one substantially amorphous electrically insulating layer, one substantially amorphous electrically insulating layer can be positioned between two nanocrystalline layers.

In various embodiments, each of the one or more nanocrystalline layers may have a grain size (e.g. grain diameter) of 1 μm or less, 20 nm or less, 15 nm or less, 10 nm or less, etc. Such grain size leads to small grain boundary having the following advantages. First, contact angle measurement on nanocrystalline $MoS_2$ shows improved wettability properties compared to single crystal $MoS_2$. This in turn allows for the uniform formation of the insulating layer on each of the nanocrystalline layers while preserving the reduced thickness. Another advantage is that the metal ion diffusivity is higher through the grain boundaries with such grain sizes. This ion diffusion is the main mechanism for, e.g. the type of ReRAM presented herein, forming/breaking metal paths through the cell in order to achieve the different states (Conductive Bridge RAM). In other words, the smaller grain size not only provides an increased surface area of the grain boundary, but also allows for more grains to be fitted within a layer, facilitating more of the ion diffusion thus improving the device performance.

In various embodiments, the transition metal dichalcogenide includes $MoS_2$, $WS_2$, $MoSe_2$, $WSe_2$, $WTe_2$, or $MoTe_2$.

In various embodiments, the substantially amorphous electrically insulating layer further includes a polymer. The polymer can include poly methyl methacrylate (PMMA). During the transfer process described hereinafter, the initial PMMA coating may be ~500 nm, which may be sufficiently thick enough to hold the nanocrystalline layer (e.g. $MoS_2$ film~6 nm). After a post-annealing and/or chemical etching process, the PMMA layer may be thinned down to only a few nanometers. PMMA is a polymer suitably used for the transfer of transition metal dichalcogenides. Other than PMMA, polymers such as polystyrene (PS) and polycarbonate (PC) may be used. Advantageously, the processing temperatures may be varied based on the polymer used without affecting the electrical performance of the resultant multilayered structure. The presence of an insulating polymer such as PMMA allows the electrical device to work. This is possible as the thickness of the insulating layer is largely reduced. If the insulating layer thickness is increased, the conductive paths can still be created but at the expense of a larger potential (voltage) required for switching, which may cause other problems such as more power/energy consumption on switching and device degradation.

In various embodiments, the transition metal of the transition metal oxide includes Mo or W.

Each of the one or more nanocrystalline layers can have a minimum thickness of an atomic monolayer of the transition metal dichalcogenide, such as 0.6 nm, 6 nm, etc. In various instances, the minimum thickness may range from 0.6 nm to 1 μm, or 6 nm to 1 μm, as examples. Such thickness may be advantageous for metal ion diffusion through the layers. For example, a monolayer of $MoS_2$ may have a thickness of about 0.6 nm. In various embodiments, each of the substantially amorphous electrically insulating layer may have a thickness of about 1 nm, 2 nm, or 3 nm, etc. In various instances, the substantially amorphous electrically insulating layer may have a thickness ranging from 1 nm to 100 nm as a non-limiting example.

The present disclosure also provides for a resistive memory device that includes the multilayered structure described in various embodiments of the first aspect.

Embodiments and advantages described for the present multilayered structure of the first aspect can be analogously valid for the present resistive memory device subsequently described herein, and vice versa. As the various embodiments and advantages have already been described above and via the examples demonstrated herein, they shall not be iterated for brevity.

The resistive memory device may further include a first electrode and a second electrode, wherein (i) the first electrode is electrically conductive and comprises a reactive metal and (ii) the second electrode is electrically conductive and comprises a non-reactive metal. The term "reactive metal", in the present context, refers to a metal that can diffuse into the nanocrystalline layer and the substantially amorphous layer upon a voltage or current applied thereto. The reactive metal can include silver, copper or aluminum. The non-reactive metal can include gold, tungsten, or platinum.

The present disclosure further provides a process of fabricating the multilayered structure described in various embodiments of the first aspect. The process includes providing a substrate comprising a nanocrystalline layer and a polymer layer deposited thereon, wherein the polymer layer is deposited on the nanocrystalline layer, wherein the nanocrystalline layer comprises a transition metal dichalcogenide, separating the nanocrystalline, layer with the polymer layer thereon from the substrate in an aqueous medium, arranging the nanocrystalline layer with the polymer layer thereon on a target substrate which is heated prior to having the nanocrystalline layer and the polymer layer arranged thereon, wherein the target substrate is heated to a temperature which renders formation of a substantially amorphous electrically insulating layer on the nanocrystalline layer, wherein the substantially amorphous electrically insulating layer comprises a transition metal oxide, wherein the transition metal oxide comprises a transition metal which is identical to the transition metal of the transition metal dichalcogenide, and removing the polymer layer from the nanocrystalline layer.

Embodiments and advantages described for the present multilayered structure of the first aspect and present resistive memory device can be analogously valid for the present method subsequently described herein, and vice versa. As the various embodiments and advantages have already been described above and via the examples demonstrated herein, they shall not be iterated for brevity.

The process may further include depositing a supporting layer on the polymer layer prior to separating the nanocrystalline layer with the polymer layer thereon from the substrate in an aqueous medium. The PDMS/thermal release tape can serve as a mechanical support for the polymer/nanocrystalline layer structure, e.g. $PMMA/MoS_2$. As described herein, the thickness of, e.g. $MoS_2$, in the present disclosure may be only a few nm, which is first supported by PMMA layer (~500 nm). However, this may be structurally insufficient for manipulation/handling if there is no additional support such as the PDMS layer or thermal release tape which is about few mm thick. This then advantageously allows the manipulation of wafer transfer and the scale of wafer transfer, especially for large scale transfers. In various embodiments, the aqueous medium is deionized water.

The process may further include annealing the target substrate that includes the nanocrystalline layer but having the polymer layer already removed therefrom, and heating the annealed target substrate prior to arranging another set of the nanocrystalline layer and the polymer layer on the target substrate.

In various embodiments, providing the substrate includes depositing the transition metal dichalcogenide by physical vapor deposition on the substrate to form the nanocrystalline layer, and spin coating a polymer solution on the nanocrystalline layer to form the polymer layer. The polymer solution can include a polymer dissolved in an organic solvent, wherein the organic solvent can include anisole. Other organic solvents depending on the polymer may be used.

In various embodiments, depositing the supporting layer includes drying the polymer layer, and arranging the supporting layer on the polymer layer. The supporting layer can include polydimethylsiloxane or a thermal release tape. The thermal release tape may be any commercially available thermal release tape that is suitable for the present process. The thermal release tape may be an adhesive that becomes peel-able when heat is applied. The thermal release tape may be formed from an acrylic polymer as one non-limiting example.

The process may further include detaching the supporting layer polymer layer after arranging the nanocrystalline layer with the polymer layer thereon on the target substrate.

In various embodiments, the temperature for forming the amorphous electrically insulating layer may range from 120° C. to 170° C., 130° C. to 170° C., 140° C. to 170° C., 150° C. to 170° C., 160° C. to 170° C., 120° C. to 150° C., 150° C. to 170° C., etc. Advantageously, such low temperatures are already capable of forming the amorphous electrically insulating layer instantaneously when the nanocrystalline layer having the polymer layer thereon is arranged on the target substrate. As an example, the surface oxidation of the nanocrystalline layer (e.g. $MoS_2$) renders an insulating native oxide layer thereon. In addition, the polymer layer (e.g. PMMA) melts and hardens to form a layer thereon, after the temperature reaches, e.g. 150° C., PMMA starts to harden. While the polymer hardening may be an undesirable process for polymers used in photolithography, this is conversely advantageous for the present process in order to form a controllable insulating layer on the top of $MoS_2$. The insulating layer may also be formed by other processes such as atomic layer deposition, chemical or physical vapor deposition, etc.

The word "substantially" does not exclude "completely" e.g. a composition which is "substantially free" from Y may be completely free from Y. Where necessary, the word "substantially" may be omitted from the definition of the present disclosure.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

Unless specified otherwise, the terms "comprising" and "comprise", and grammatical variants thereof, are intended to represent "open" or "inclusive" language such that they include recited elements but also permit inclusion of additional, unrecited elements.

EXAMPLES

The present disclosure relates to a multilayer structure having alternating layers of atomically smooth metal chalcogenides layer and an insulating layer, wherein the metal chalcogenides layer has a nanocrystalline grain size of about 20 nm or 10 nm.

The multilayer structure may further include a reactive conductive electrode and a non-reactive conductive electrode on each side of the multilayer structure to be configured or operable as a resistive memory device.

The present disclosure also relates to a process for making the multilayer structure. The process may include (a) removing a nanocrystalline metal chalcogenide film from a substrate, wherein the metal chalcogenide film is coated with a first polymer layer and a second supporting layer, (b) preheating a target substrate at a desired temperature, contacting the supporting layer/polymer/metal chalcogenide structure with the target substrate, and releasing the supporting layer to leave the polymer/metal chalcogenide structure contacted with the target substrate, (c) removing the polymer layer, and (d) repeating steps (a) to (c) until a desired layer number of metal chalcogenide film is achieved.

The present multilayered structure, present resistive memory device, and present method of fabricating the multilayered structure, are described in further details, by way of non-limiting examples, as set forth below.

Example 1

Device Structure

Figure 1:
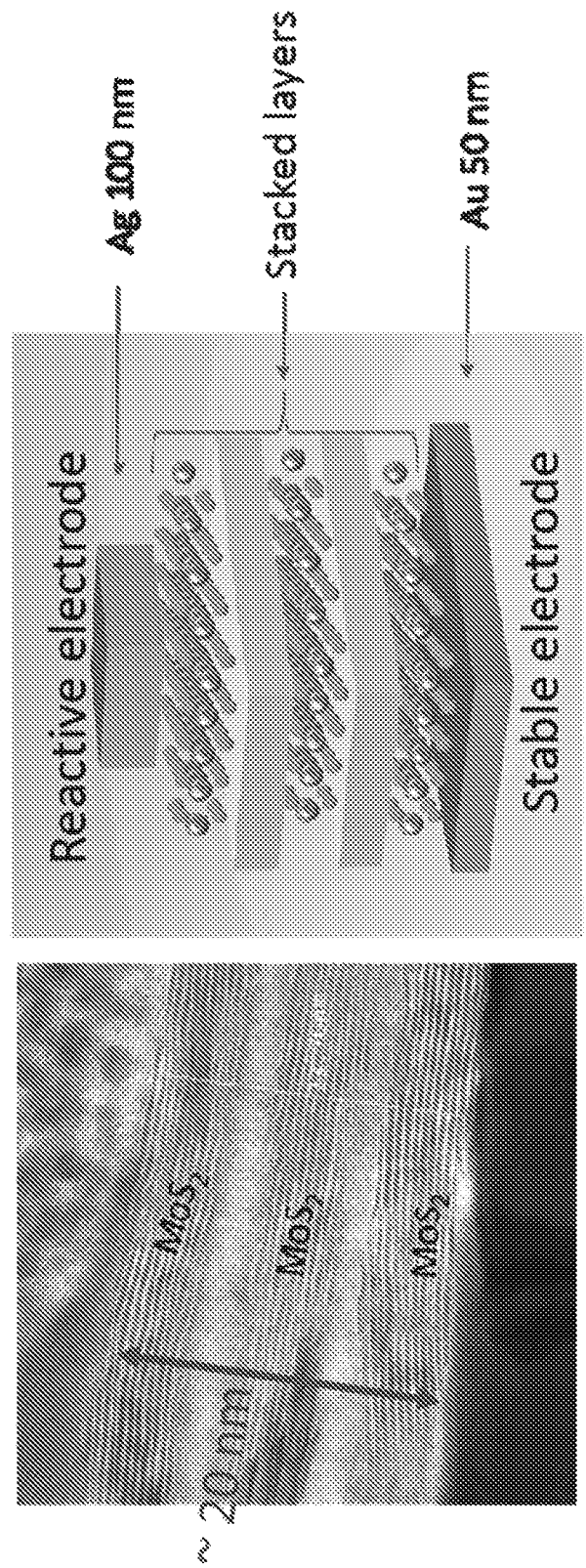
FIG. 1 depicts two images. The left image is a high resolution transmission electron microscopy (HRTEM) of a cross section of the multilayered molybdenum disulfide structure in a ReRam device. The right mage shows a schematic of the structure in the device of the left image.

A schematic and TEM cross section of a device having the multilayered structure is shown in FIG. 1. The structure includes stacking layers of molybdenum disulfide to increase the on/off ratio. As can be seen in the left image, the layers alternate between nanocrystalline molybdenum disulfide layers and an insulating layer. The multilayered structure is sandwiched between two electrodes as shown in right image of FIG. 1. In this instance, two different electrodes (one gold, the other silver) are used. In certain instances, the nanocrystalline layer may include hexagonal boron nitride (hBN). In certain instances, the nanocrystalline layer may be hBN instead of a transition metal dichalcogenide.

Example 2

A Non-Limiting Example of the Present $MoS_2$ Layers and Grain Size

While various transition dichalcogenides have been worked on for the present disclosure, molybdenum disulfide layers are used as a non-limiting example to demonstrate the present disclosure.

The present multilayered structure, produced by the present process, e.g. sputtering, can render large area growth of the various areas (e.g. 6 inch diameter wafers). The molybdenum disulfide crystals atomically grown in a layer are uniform with a nanoscale grain size.

Conventionally, grain boundaries in monolayer molybdenum disulfide have shown resistive switching in a horizontal configuration. However, to ensure the presence of the grain boundaries, the resistive memory device cannot be easily scaled down without compromising performance. In addition, memories based purely on grain boundaries undesirably result in small on/off ratio ($\sim 10^2$). The present disclosure, including the present multilayered structure and process for producing the multilayered structure, based on PVD sputtered molybdenum disulfide layers addresses one or more of these limitations. For example, nanoscale grains are achieved to ensure the presence of grain boundaries under the electrode, which allows further scaling down/up of the device. Controlled thickness deposition with minimum roughness is achieved, which allows the fabrication of vertical devices rather than horizontal ones that renders the present multilayered structure and process operable for electronic hyperscaling (3D electronics). These are demonstrated by the TEM results in FIGS. 2A and 2B, in which the desirably small grain boundaries overlap even in areas smaller than 10 nm.

Example 3

Fabrication of Multilayered Structure (Transfer Process)

Figure 3:
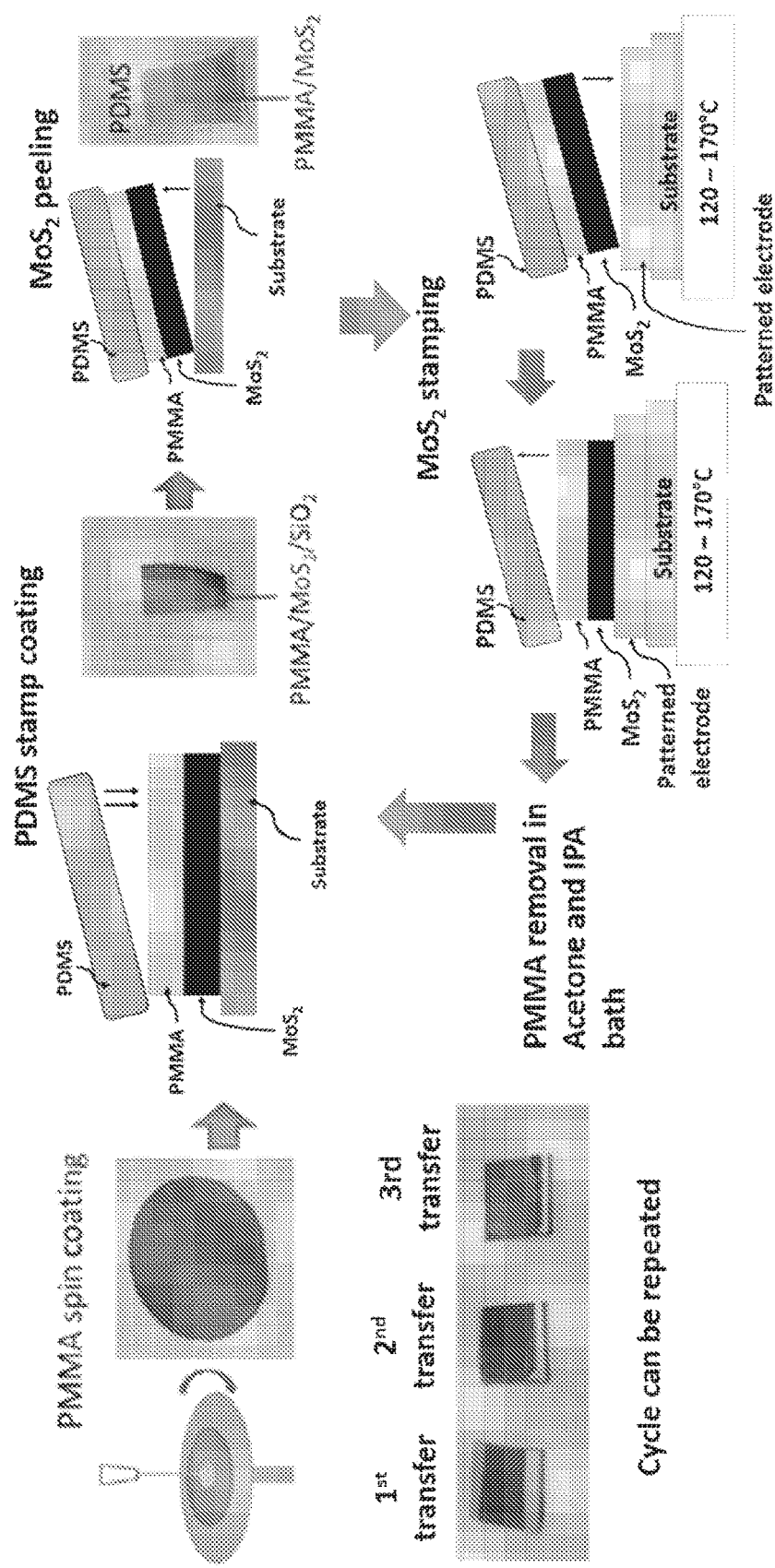
FIG. 3 shows a schematic diagram of the present process, which involves transferring of the various layers for vertical stacking.

A water-free transfer process is utilized for the manipulation and transferring of the present PVD $MoS_2$ film. The water-free transfer process involves a target substrate that allows the stacking of layers without affecting underneath layers during the repeated transfer process. This is particularly advantageous for transfer of the sensitive materials used in the present process. An example of the present fabrication process is described below, using $MoS_2$ as a non-limiting example of the transition metal dichalcogenides. The process is illustrated in FIG. 3.

1. A nanocrystalline $MoS_2$ film with a desired thickness already formed on a substrate was first spin coated with a solution of poly methyl methacrylate (PMMA 950K $M_w$) at a concentration of 3.5 wt %, wherein the PMMA was dissolved in anisole (an organic solvent for PMMA). The nanocrystalline $MoS_2$ film was first formed via, for example, PVD sputtering. $M_w$ denotes molecular weight.

2. After the PMMA polymer was dried, a second supporting layer can be added for better mechanical support. For example, two out of the various supporting layers tested include (1) a 2 mm thickness polydimethylsiloxane (PDMS) and (2) a commercially purchased thermal release tape (Revalpha 120° C.). These two supporting layers showed that different supporting materials can be used, demonstrating versatility of the present process and high compatibility with various supporting materials.

3. The whole structure was then immersed in deionized (DI) water and subsequently peeled to separate the $MoS_2$ layer from the substrate mentioned above in step (1). The DI water helps in delamination of the 2D material from the substrate. The DI water need not be used, but when used, it advantageously minimizes formation of cracks and pinholes in the various layers. While DI water is used herein, the process may still be referred to as being water free as the last stage of the process (i.e. after the stamping process, the target substrate is not contacted with water). Said differently, the present multilayered structure can be formed on various substrates, including those sensitive to water or oxygen (e.g. in OLED—organic light emitting diode).

4. After peeling, the combined structure of supporting layer/PMMA/MoS$_2$ structure was then carefully dried with nitrogen gas.

5. Then, the target substrate with patterned electrode was pre-heated at a temperature of 120 to 170° C. (120° C. for thermal release tape and 150 to 170° C. for PDMS) and the supporting layer/PMMA/MoS$_2$ structure is placed on the top of the target substrate, instantly, the PDMS or thermal release tape is released, leaving the PMMA/MoS$_2$ structure attached to the electrode coated substrate. The temperature for releasing the supporting layer (e.g. PDMS or thermal release tape) can be used to expedite the time for detaching the supporting layer (e.g. 150° C.—few seconds and at 170° C.—instantly detached). In this step, there are two parameters to be considered for forming the insulating layer: pre-heating time and temperature of the target substrate. Distinguished from known polymer transfer process utilizing low temperatures in vacuum, the present process involves a longer pre-heating (e.g. in air) and/or higher temperature to promote formation of the insulating layer. For example, at 170° C., 5 mins of pre-heating was sufficient to render formation of the insulating layer. At 120° C., pre-heating over 2 hrs may be required.

6. The PMMA is partially removed by an acetone bath followed by isopropyl alcohol (IPA) cleaning. The entire structure may be fully immersed in the acetone bath. After the annealing process, PMMA may be partially hardened so it is not completely removed by acetone leaving a very thin insulation layer on the top of MoS$_2$.

7. Then the MoS$_2$ is dried with nitrogen gas.

The above steps can be repeated to form the multilayered structured of transition metal dichalcogenide and amorphous insulating layer, wherein the transition metal dichalcogenide and amorphous insulating layer are formed in an alternating arrangement. For example, steps (1) to (4) can be repeated. For step (5), the next set of supporting layer/PMMA/MoS$_2$ structure is then placed on the earlier formed MoS$_2$/insulating layer structure already on the target substrate. In order to facilitate the formation of the secondary layer (i.e. to add another set of the supporting layer/PMMA/MoS$_2$ structure), during step (5) of the transfer process, the target substrate with MoS$_2$ can be annealed at 170° C. for 5 mins or more prior to placing the next supporting layer/PMMA/MoS$_2$ structure.

The present process is in contrast to reported methods, wherein reactive metal is used for both electrodes. Instead, in the present process, only one reactive electrode is used due to the symmetry and reduced thickness of the multilayered structure.

Example 4

Discussion of Present Multilayered Structure

The present multilayered structure can be elaborated by virtue of illustration s shown in FIG. 7 and FIG. 8A to 8C.

Figure 7:
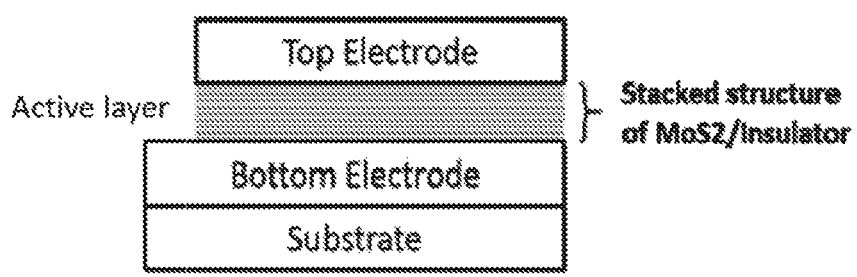
FIG. 7 is a schematic of a vertically stacked memory device of the present disclosure (not to scale).
Figure 8:
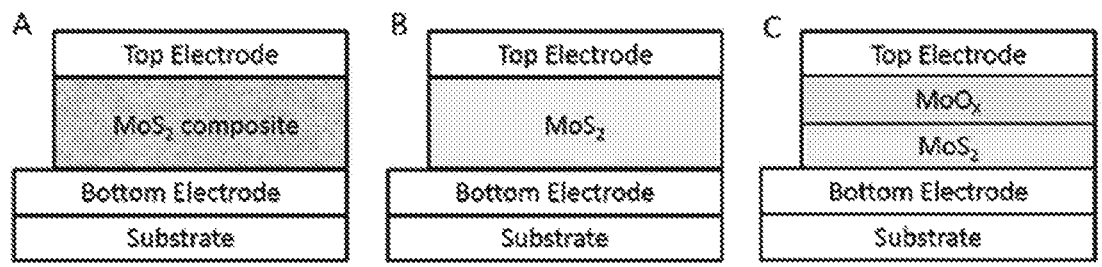
FIG. 8A shows the structure of a conventional vertical memory device configuration (not to scale), wherein the active layer is just one layer of $MoS_2$ composite.
FIG. 8B shows the structure of a conventional vertical memory device configuration (not to scale), wherein the active layer is just one layer of $MoS_2$ material.
FIG. 8C shows a non-limiting example of the structure for a vertical memory device configuration of the present disclosure (not to scale), wherein the active layer includes one layer of $MoS_2$ formed adjacent to one insulating layer of $MoO_x$, wherein $0 < x \leq 3$. The insulating layer is an amorphous insulating layer that may include a mixture of molybdenum oxide nd the poly methyl methacrylate (PMMA), wherein the PMMA may be residual PMMA. The formation of the mixture of molybdenum oxide and PMMA can be controlled by heating. This insulating layer renders excellent resistive performance. Two devices (i.e. with and without the insulating layer) have been compared and it is observed that the one with the insulating layer has much superior device performance.

As shown in FIG. 7, the present multilayered structure is operable/usable in a vertical memory device that includes embedded multiple transition metal dichalcogenide (e.g. MoS$_2$) stacked layers, wherein each of the transition metal dichalcogenide layers are separated by a thin insulating layer. Said differently, a transition metal dichalcogenide layer is formed adjacent to the insulating layer. With this configuration, it can be envisaged that one insulating layer is positioned adjacent to and between two transition metal dichalcogenide layers. The transition metal dichalcogenide layer (e.g. MoS$_2$) is nanocrystalline and the insulating layer is amorphous with highly resistive property (FIG. 7). The present memory device having such multiple nanocrystalline MoS$_2$/amorphous stacked layers exhibits excellent resistive switching behavior and is different from conventional device structures shown in FIG. 8A to 8C. The multilayered structure stacked in the manner as described herein improves the on/off ratio of the device at reduced thickness. The nanocrystalline transition metal dichalcogenide, e.g. MoS$_2$, facilitates the formation of conductive paths while the insulating layer increases the off resistance state. On the other hand, the structures shown in FIG. 8A to 8C either suffer from reduced thickness at the expense of on/off ratio and/or undesirably having a thicker active layer just to improve the on/off ratio.

The present stacked structure advantageously involves a low temperature transfer process as described above and as illustrated in FIG. 3. It is challenging to grow similar stacked structure relying on conventional consecutive growing methods, as high temperature tends to be required for the growth of transition metal dichalcogenide such as MoS$_2$.

The nanocrystalline transition metal dichalcogenide, such as the MoS$_2$ layer, can be deposited by photo vapor deposition and then transferred onto the device structure. The present growth parameters of the transition metal dichalcogenide used advantageously produces nanoscale grain size that facilitates the diffusion of Ag. In this regard, the ReRAM cell of the present disclosure may be a CBRAM (Conductive bridge RAM) in which the reactive metal (Ag in this case) diffuses through the cell creating a metal conduction path between the top and bottom electrode forming a low resistance state (LRS), when the potential is inverted, the Ag ions retract so the metal conduction path is lost creating a high resistance state (HRS). By facilitating the Ag diffusion, the performance of the CBRAM is enhanced.

Advantages of utilizing the present PVD-grown transition metal dichalcogenide (e.g. MoS$_2$) include (1) fast growth rate of the transition metal dichalcogenide due to use of the PVD process, (2) transferrable layers at low temperature, (3) large area uniformity, such as wafer-size, that meets the industry standard, (4) atomically smooth surface, and (5) nanoscale grain size with high defects concentration that facilitates the diffusion of Ag.

The minimum thickness for each layer, which is one continuous atomic layer of each material, can be about 0.6 nm. As an example, the thickness may range from about 0.6 nm to about 1 μm. The layers are continuous, which helps avoid direct contact between the top and bottom electrode. If not, the device may be short-circuited when operated. The electrodes ensure to overlap grain boundaries of the nanocrystalline MoS$_2$ layer. In the TEM top-down image of FIG. 2B, it is possible to observe the grains by the colour contrast. As the grain size is in the nanometre range, placing a top electrode having grain sizes larger than the grain size of the nanocrystalline layer may render overlapping some of those grain boundaries.

One of the two electrode materials can be a non-reactive conductive material. (i.e. conduct electricity without diffusion into the active layer). If both metal electrodes are reactive, then the cell or device may not successfully switch to HRS after the conduction paths are created. The other electrode materials can be a reactive conductive material (in the context of the present disclosure, silver was used as a non-limiting example but other reactive metals such as copper and aluminum can be used).

The current-voltage (I-V) curves of present device can exhibit a hysteresis loop, which indicates a bipolar variable resistance behavior. The present multilayered structure can be operable as an active layer in any vertical memory device structure with more than one pair of transition metal dichalcogenide, e.g. $MoS_2$, stacked layers. This is in contrast to other active layers (FIG. 9), such as $MoS_2$ composite ($MoS_2$-PVP, $MoS_2$-GO, $MoS_2$-MOF, $MoS_{2-x}O_x$) and partially oxidized $MoS_2$. Moreover, the present stacked layers are transferrable with atomically smooth surface and large area uniformity in the production process. An improved device performance, for example, using the $MoS_2$ stacked structure has been achieved. The device performance is discussed below.

Example 5

Device Performance

Figure 4A:
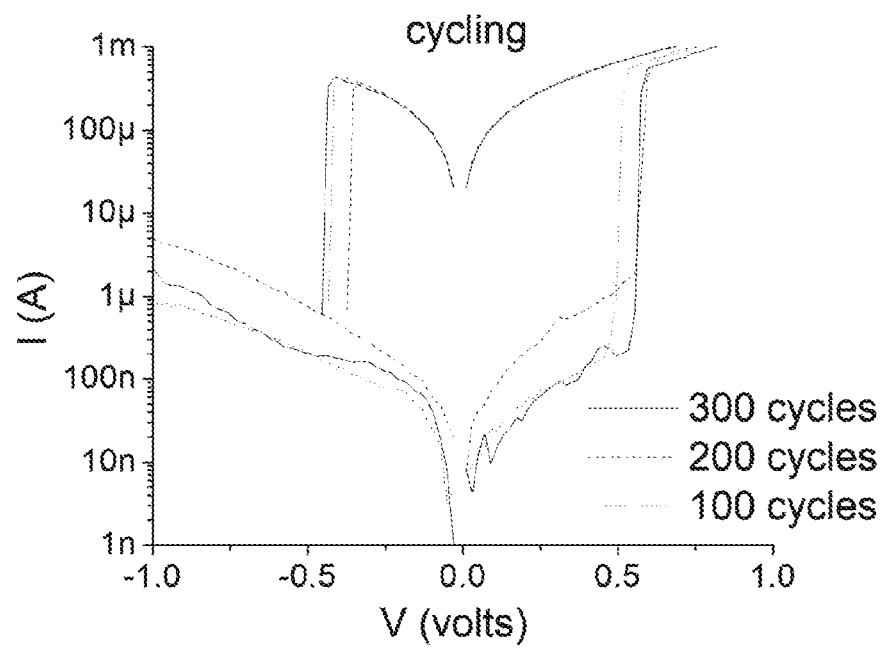
FIG. 4A shows the direct current (DC) cycling plot of a device having the present multilayered structure.
Figure 4B:
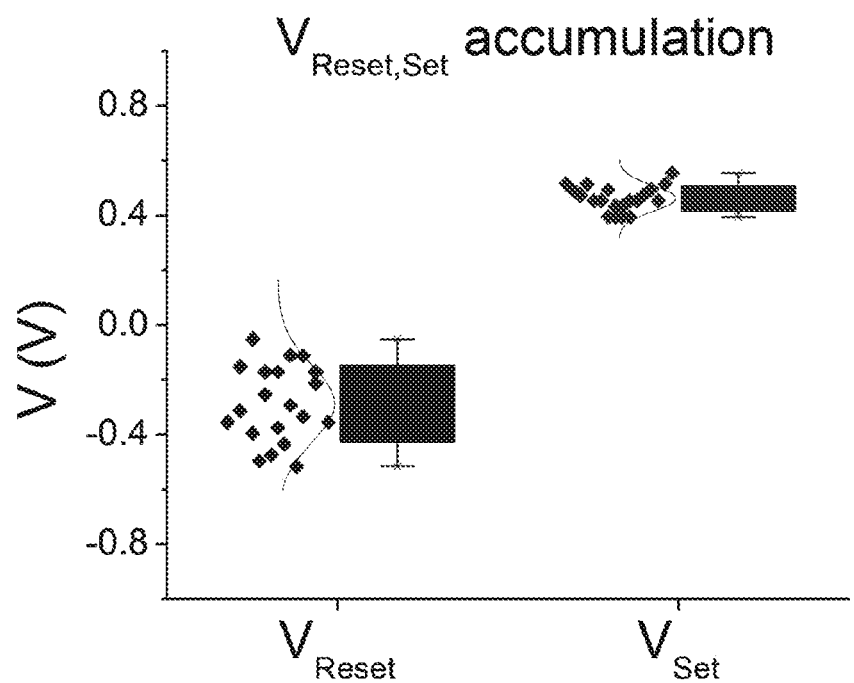
FIG. 4B shows the $V_{set/reset}$ cumulative box plot or a device having the present multilayered structure.

The electrical characteristics of the present devices are shown in FIGS. 4A and 4B, which include direct current (DC) cycling and the set/reset voltage ($V_{set/reset}$) cumulative box chart. Specifically, the present devices having the multilayered structure exhibit less than ±0.5 V with an on/off ratio of ~4 orders of magnitude as shown in FIG. 4.

Figure 5A:
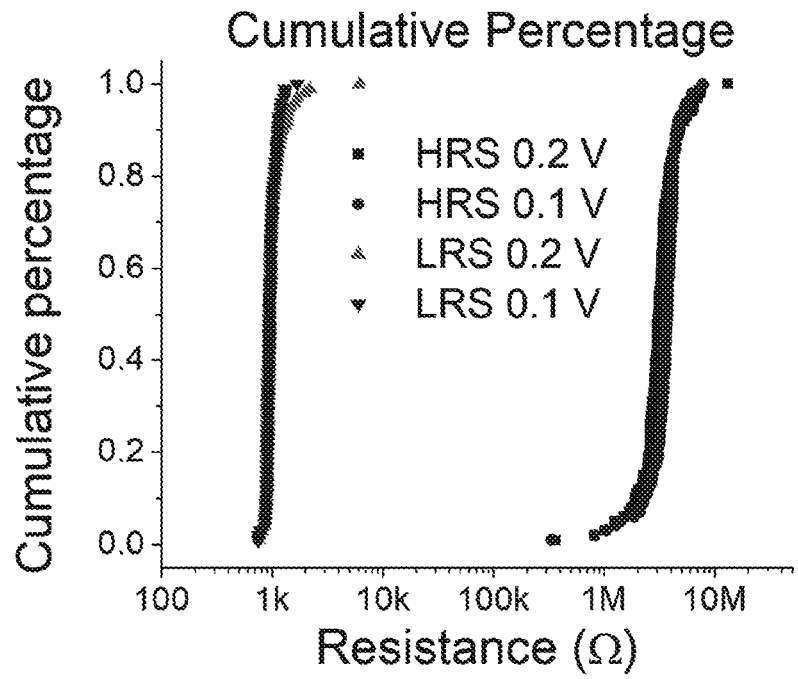
FIG. 5A shows a plot of the cumulative percentage measurement for 100 cycles for both low resistance state (LSR) and high resistance state (HRS) under DC cycling.
Figure 5B:
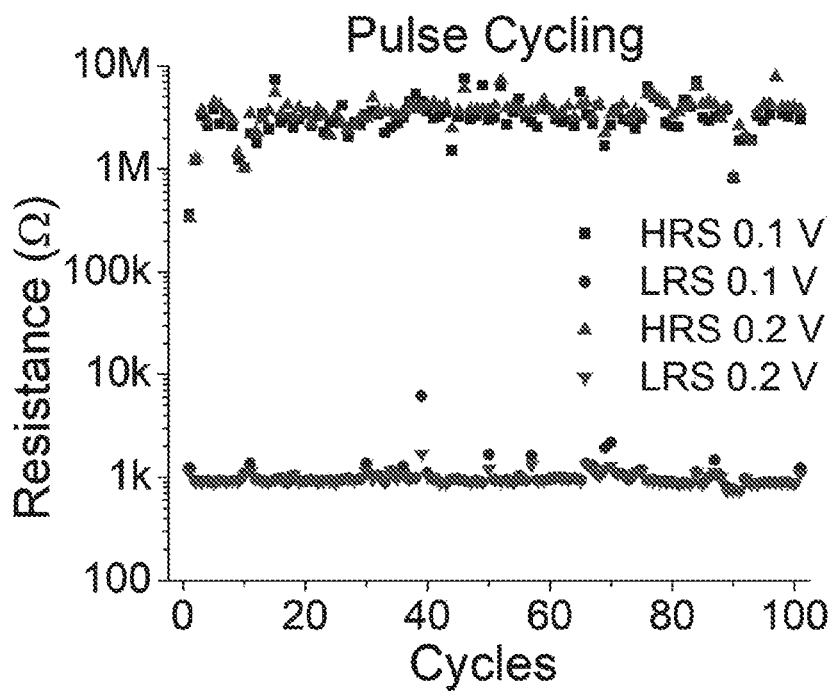
FIG. 5B is a plot of the results for the cycling pulse test.

The devices also show good stability as demonstrated in cumulative percentage measurement on 100 cycles (FIG. 5A) for both low and high resistance states.

Figure 6A:
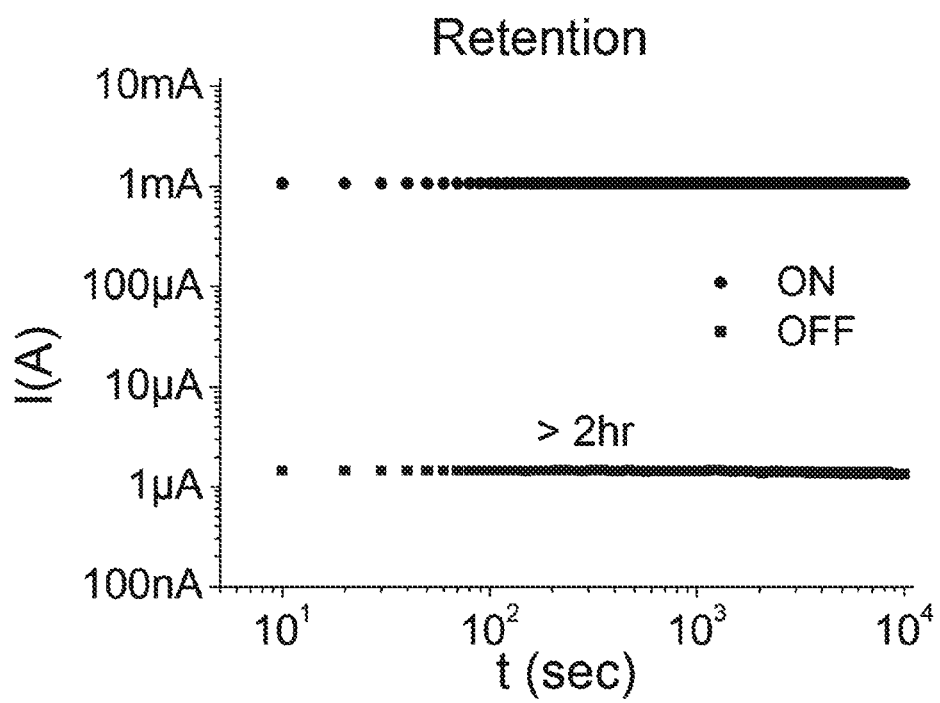
FIG. 6A shows a plot of the results of the retention test.
Figure 6B:
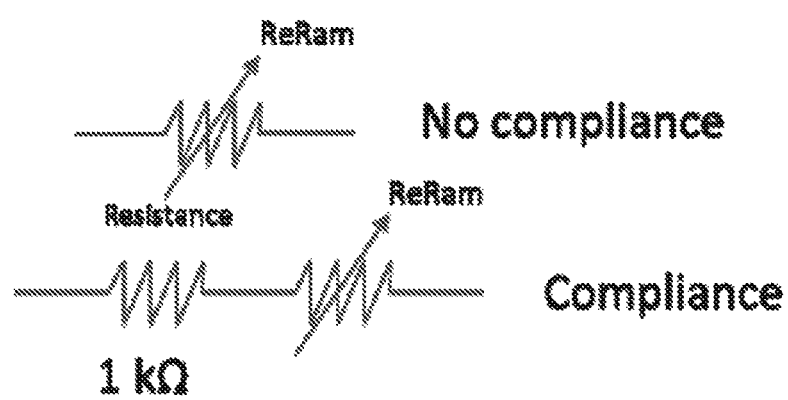
FIG. 6B is a schematic diagram illustrating the ReRAM connected in series with an additional resistor (under compliance) in the bottom image and without the additional resistor (no compliance) in the top image to limit the current during switching.
Figure 6C:
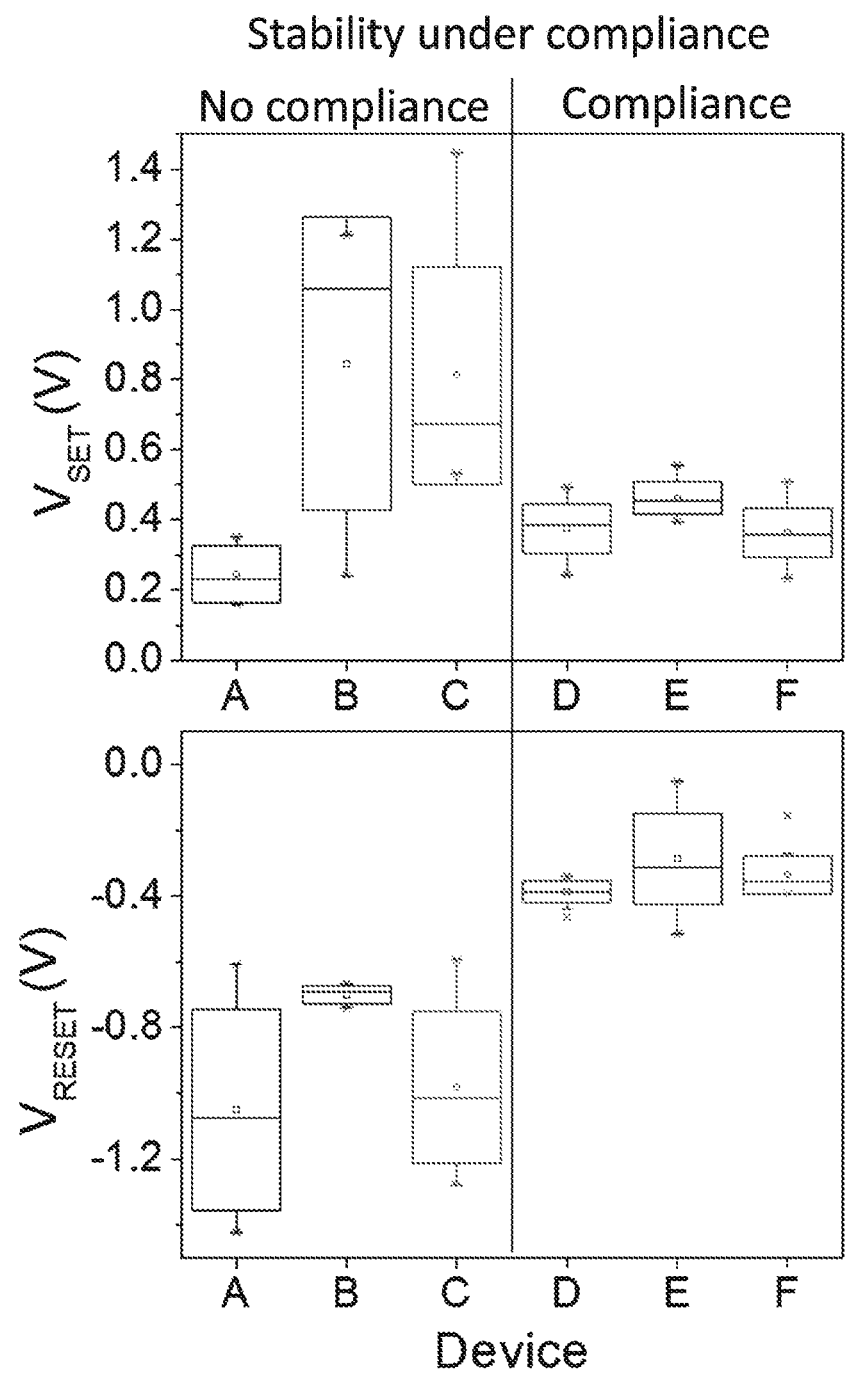
FIG. 6C depicts the stability under compliance in the form of box charts for Set, Reset voltages ($V_{set}$ and $V_{reset}$) of different cells with (compliance) and without (no compliance) the additional resistor connected in series.

Finally, a retention performance of the present device was tested, and it is observed that there is no variation of both high and low resistance states under 8000 sec as shown in FIG. 6A.

All the results demonstrate herein show the promising application of the present sputtered transition metal dichalcogenide (e.g. $MoS_2$) multilayered structure operable as a non-volatile memory device.

While the present disclosure has been particularly shown and described with reference to specific embodiments, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A multilayered structure comprising:
   one or more nanocrystalline layers each comprising a transition metal dichalcogenide;
   one or more substantially amorphous electrically insulating layers each comprising a transition metal oxide, wherein the transition metal oxide comprises a transition metal which is identical to the transition metal of the transition metal dichalcogenide;
   wherein the one or more nanocrystalline layers and the one or more substantially amorphous electrically insulating layers are formed in an alternating manner,
   wherein each of the one or more nanocrystalline layers is formed adjacent to the substantially amorphous insulating layer, and
   wherein one substantially amorphous electrically insulating layer is positioned between two nanocrystalline layers.

2. The multilayered structure of claim 1, wherein each of the one or more nanocrystalline layers has a grain size of less than 1 μm.

3. The multilayered structure of claim 1, wherein the transition metal dichalcogenide comprises $MoS_2$, $WS_2$, $MoSe_2$, $WSe_2$, $WTe_2$, or $MoTe_2$.

4. The multilayered structure of claim 1, wherein the substantially amorphous electrically insulating layer further comprises a polymer, wherein the polymer comprises poly methyl methacrylate, polystyrene, or polycarbonate.

5. The multilayered structure of claim 1, wherein the transition metal of the transition metal oxide comprises Mo or W.

6. The multilayered structure of claim 1, wherein each of the one or more nanocrystalline layers has a minimum thickness of 0.6 nm.

7. A resistive memory device comprising a multilayered structure comprising:
   one or more nanocrystalline layers each comprising a transition metal dichalcogenide;
   one or more substantially amorphous electrically insulating layers each comprising a transition metal oxide, wherein the transition metal oxide comprises a transition metal which is identical to the transition metal of the transition metal dichalcogenide;
   wherein the one or more nanocrystalline layers and the one or more substantially amorphous electrically insulating layers are formed in an alternating manner,
   wherein each of the one or more nanocrystalline layers is formed adjacent to the substantially amorphous insulating layer, and
   wherein one substantially amorphous electrically insulating layer is positioned between two nanocrystalline layers.

8. The resistive memory device of claim 7, further comprising a first electrode and a second electrode, wherein (i) the first electrode is electrically conductive and comprises a reactive metal and (ii) the second electrode is electrically conductive and comprises a non-reactive metal.

9. The resistive memory device of claim 8,
   wherein the reactive metal comprises silver, copper, or aluminum; and
   wherein the non-reactive metal comprises gold, tungsten, or platinum.

10. A process of fabricating a multilayered structure comprising:
    one or more nanocrystalline layers each comprising a transition metal dichalcogenide;
    one or more substantially amorphous electrically insulating layers each comprising a transition metal oxide, wherein the transition metal oxide comprises a transition metal which is identical to the transition metal of the transition metal dichalcogenide;
    wherein the one or more nanocrystalline layers and the one or more substantially amorphous electrically insulating layers are formed in an alternating manner, and
    wherein each of the one or more nanocrystalline layers is formed adjacent to the substantially amorphous insulating layer, the process comprising:
    providing a substrate comprising a nanocrystalline layer and a polymer layer deposited thereon, wherein the polymer layer is deposited on the nanocrystalline layer, wherein the nanocrystalline layer comprises a transition metal dichalcogenide;
    separating the nanocrystalline layer with the polymer layer thereon from the substrate in an aqueous medium;
    arranging the nanocrystalline layer with the polymer layer thereon on a target substrate which is heated prior to having the nanocrystalline layer and the polymer layer arranged thereon, wherein the target substrate is heated to a temperature which renders formation of a substantially amorphous electrically insulating layer on the nanocrystalline layer, wherein the substantially amorphous electrically insulating layer comprises a transition metal oxide, wherein the transition metal oxide comprises a transition metal which is identical to the transition metal of the transition metal dichalcogenide; and removing the polymer layer from the nanocrystalline layer.

11. The process of claim 10, further comprising depositing a supporting layer on the polymer layer prior to separating the nanocrystalline layer with the polymer layer thereon from the substrate in the aqueous medium.

12. The process of claim 10, further comprising:

annealing the target substrate comprising the nanocrystalline layer but having the polymer layer already removed therefrom; and heating the annealed target substrate prior to arranging another set of the nanocrystalline layer and the polymer layer on the target substrate.

13. The process of claim 10, wherein providing the substrate comprises:

depositing the transition metal dichalcogenide by physical vapor deposition on the substrate to form the nanocrystalline layer; and spin coating a polymer solution on the nanocrystalline layer to form the polymer layer.

14. The process of claim 13, wherein the polymer solution comprises a polymer dissolved in an organic solvent, wherein the organic solvent comprises anisole.

15. The process of claim 11, wherein depositing the supporting layer comprises:

drying the polymer layer; and arranging the supporting layer on the polymer layer.

16. The process of claim 11, further comprising detaching the supporting layer from the polymer layer after arranging the nanocrystalline layer with the polymer layer thereon on the target substrate.

17. The process of claim 11, wherein the supporting layer comprises polydimethylsiloxane or a thermal release tape.

18. The process of claim 10, wherein the temperature ranges from 120° C. to 170° C.

19. The process of claim 10, wherein the aqueous medium is deionized water.

* * * * *